United States Patent
Khlat

(10) Patent No.: US 12,267,046 B2
(45) Date of Patent: Apr. 1, 2025

(54) POWER AMPLIFIER SYSTEM

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 590 days.

(21) Appl. No.: 17/579,796

(22) Filed: Jan. 20, 2022

(65) Prior Publication Data
US 2022/0263474 A1   Aug. 18, 2022

Related U.S. Application Data

(60) Provisional application No. 63/149,556, filed on Feb. 15, 2021.

(51) Int. Cl.
*H03F 1/02* (2006.01)
*H03F 3/21* (2006.01)

(52) U.S. Cl.
CPC ......... *H03F 1/0233* (2013.01); *H03F 1/0288* (2013.01); *H03F 3/21* (2013.01); *H03F 2200/105* (2013.01)

(58) Field of Classification Search
CPC ........ H03F 1/0233; H03F 1/0288; H03F 3/21; H03F 2200/10
See application file for complete search history.

(56) References Cited

U.S. PATENT DOCUMENTS

| | | | |
|---|---|---|---|
| 4,646,035 A | 2/1987 | Chapelle | |
| 5,266,936 A | 11/1993 | Saitoh | |
| 5,510,753 A | 4/1996 | French | |
| 5,838,732 A | 11/1998 | Carney | |
| 6,107,862 A | 8/2000 | Mukainakano et al. | |

(Continued)

FOREIGN PATENT DOCUMENTS

| CN | 103916093 A | 7/2014 |
|---|---|---|
| CN | 104185953 A | 12/2014 |

(Continued)

OTHER PUBLICATIONS

Written Opinion for International Patent Application No. PCT/US2021/052830, mailed Nov. 3, 2022, 7 pages.

(Continued)

*Primary Examiner* — Patricia T Nguyen
(74) *Attorney, Agent, or Firm* — Withrow & Terranova, P.L.L.C.

(57) ABSTRACT

A power amplifier system having a carrier amplifier having a first supply node, a peaking amplifier having a second supply node, and envelope tracking (ET) circuitry is disclosed. The ET circuitry has a first tracking amplifier that generates a first voltage signal at the first supply node, a second tracking amplifier that generates a second voltage signal at the second supply node, and a transistor coupled between the first supply node and the second supply node. A control circuit has a first input coupled to an output of both or either of the first tracking amplifier and the second tracking amplifier and a control output terminal coupled to a control input terminal of the transistor, wherein the control circuit is configured to progressively turn on the transistor to pass current from the first supply node to the second supply node as the peaking amplifier progressively becomes active.

19 Claims, 6 Drawing Sheets

(56) References Cited

U.S. PATENT DOCUMENTS

| | | |
|---|---|---|
| 6,141,377 A | 10/2000 | Sharper et al. |
| 6,141,541 A | 10/2000 | Midya et al. |
| 6,411,531 B1 | 6/2002 | Nork et al. |
| 6,985,033 B1 | 1/2006 | Shirali et al. |
| 7,043,213 B2 | 5/2006 | Robinson et al. |
| 7,193,467 B2 | 3/2007 | Garlepp et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 | 1/2015 | Jones |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,020,453 B2 | 4/2015 | Briffa et al. |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,172,303 B2 | 10/2015 | Vasadi et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,491,314 B2 | 11/2016 | Wimpenny |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,705,451 B2 | 7/2017 | Takenaka et al. |
| 9,748,845 B1 | 8/2017 | Kotikalapoodi |
| 9,768,731 B2 | 9/2017 | Perreault et al. |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,923,520 B1 | 3/2018 | Abdelfattah et al. |
| 10,003,416 B1 | 6/2018 | Lloyd |
| 10,084,376 B2 | 9/2018 | Lofthouse |
| 10,090,808 B1 | 10/2018 | Henzler et al. |
| 10,090,809 B1 | 10/2018 | Khlat |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,116,470 B2 | 10/2018 | Gu et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,126 B1 | 5/2019 | Wei et al. |
| 10,291,181 B2 | 5/2019 | Kim et al. |
| 10,326,408 B2 | 6/2019 | Khlat et al. |
| 10,361,744 B1 | 7/2019 | Khlat |
| 10,381,983 B2 | 8/2019 | Balteanu et al. |
| 10,382,071 B2 | 8/2019 | Rozek et al. |
| 10,476,437 B2 | 11/2019 | Nag et al. |
| 10,622,900 B1 | 4/2020 | Wei et al. |
| 10,756,675 B2 | 8/2020 | Leipold et al. |
| 10,862,431 B1 | 12/2020 | Khlat |
| 10,873,260 B2 | 12/2020 | Yan et al. |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 11,637,531 B1 | 4/2023 | Perreault et al. |
| 11,848,564 B2 | 12/2023 | Jung et al. |
| 2002/0021110 A1 | 2/2002 | Nakagawa et al. |
| 2002/0157069 A1 | 10/2002 | Ogawa et al. |
| 2002/0167827 A1 | 11/2002 | Umeda et al. |
| 2003/0107428 A1 | 6/2003 | Khouri et al. |
| 2004/0201281 A1 | 10/2004 | Ma et al. |
| 2004/0266366 A1 | 12/2004 | Robinson et al. |
| 2005/0088160 A1 | 4/2005 | Tanaka et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0036212 A1 | 2/2007 | Leung et al. |
| 2007/0052474 A1 | 3/2007 | Saito |
| 2007/0053217 A1 | 3/2007 | Darroman |
| 2007/0258602 A1 | 11/2007 | Vepsalainen et al. |
| 2007/0290748 A1 | 12/2007 | Woo et al. |
| 2008/0116960 A1 | 5/2008 | Nakamura |
| 2008/0231115 A1 | 9/2008 | Cho et al. |
| 2008/0231358 A1 | 9/2008 | Maemura |
| 2008/0239772 A1 | 10/2008 | Oraw et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0019052 A1 | 1/2010 | Yip |
| 2010/0039321 A1 | 2/2010 | Abraham |
| 2010/0283534 A1 | 11/2010 | Pierdomenico |
| 2010/0308919 A1 | 12/2010 | Adamski et al. |
| 2011/0068757 A1 | 3/2011 | Xu et al. |
| 2011/0074373 A1 | 3/2011 | Lin |
| 2011/0136452 A1 | 6/2011 | Pratt et al. |
| 2011/0148705 A1 | 6/2011 | Kenington |
| 2011/0175681 A1 | 7/2011 | Inamori et al. |
| 2011/0199156 A1* | 8/2011 | Hayakawa ............ H03F 1/0288 |
| | | 330/124 R |
| 2011/0279179 A1 | 11/2011 | Vice |
| 2012/0062031 A1 | 3/2012 | Buthker |
| 2012/0194274 A1 | 8/2012 | Fowers et al. |
| 2012/0200435 A1 | 8/2012 | Ngo et al. |
| 2012/0274134 A1 | 11/2012 | Gasparini et al. |
| 2012/0281597 A1 | 11/2012 | Khlat et al. |
| 2012/0286576 A1 | 11/2012 | Jing et al. |
| 2012/0299645 A1 | 11/2012 | Southcombe et al. |
| 2012/0299647 A1 | 11/2012 | Honjo et al. |
| 2012/0326691 A1 | 12/2012 | Kuan et al. |
| 2013/0021827 A1 | 1/2013 | Ye |
| 2013/0063118 A1 | 3/2013 | Nguyen et al. |
| 2013/0072139 A1 | 3/2013 | Kang et al. |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0176961 A1 | 7/2013 | Kanamarlapudi et al. |
| 2013/0187711 A1 | 7/2013 | Goedken et al. |

(56) References Cited

U.S. PATENT DOCUMENTS

| | | |
|---|---|---|
| 2013/0200865 A1 | 8/2013 | Wimpenny |
| 2013/0207731 A1 | 8/2013 | Balteanu |
| 2013/0234513 A1 | 9/2013 | Bayer |
| 2013/0234692 A1 | 9/2013 | Liang et al. |
| 2013/0271221 A1 | 10/2013 | Levesque et al. |
| 2013/0288612 A1 | 10/2013 | Afsahi et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0097820 A1 | 4/2014 | Miyamae |
| 2014/0103995 A1 | 4/2014 | Langer |
| 2014/0145692 A1 | 5/2014 | Miyamae |
| 2014/0155002 A1 | 6/2014 | Dakshinamurthy et al. |
| 2014/0169427 A1 | 6/2014 | Asenio et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0213196 A1 | 7/2014 | Langer et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Im et al. |
| 2015/0139358 A1 | 5/2015 | Asuri et al. |
| 2015/0145600 A1* | 5/2015 | Hur .................. H03F 1/0233 330/295 |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0302845 A1 | 10/2015 | Nakano et al. |
| 2015/0311791 A1 | 10/2015 | Tseng et al. |
| 2015/0326114 A1 | 11/2015 | Rolland |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0018718 A1 | 1/2017 | Jang et al. |
| 2017/0141736 A1 | 5/2017 | Pratt et al. |
| 2017/0149240 A1 | 5/2017 | Wu et al. |
| 2017/0187187 A1 | 6/2017 | Amin et al. |
| 2017/0302183 A1 | 10/2017 | Young |
| 2017/0317913 A1 | 11/2017 | Kim et al. |
| 2017/0331433 A1 | 11/2017 | Khlat |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0123516 A1 | 5/2018 | Kim et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309409 A1* | 10/2018 | Khlat .................. H03F 1/0288 |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068051 A1 | 2/2019 | Yang et al. |
| 2019/0068234 A1 | 2/2019 | Khlat et al. |
| 2019/0097277 A1 | 3/2019 | Fukae |
| 2019/0103766 A1 | 4/2019 | Von Novak, III et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0199215 A1 | 6/2019 | Zhao et al. |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0288645 A1 | 9/2019 | Nag et al. |
| 2019/0222175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0091878 A1 | 3/2020 | Maxim et al. |
| 2020/0106392 A1 | 4/2020 | Khlat et al. |
| 2020/0127608 A1 | 4/2020 | Khlat |
| 2020/0127625 A1 | 4/2020 | Khlat |
| 2020/0127730 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0304020 A1 | 9/2020 | Lu et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328677 A1 | 10/2020 | Amin et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0350866 A1* | 11/2020 | Pehlke .................. H03F 1/0222 |
| 2020/0350878 A1 | 11/2020 | Drogi et al. |
| 2020/0382061 A1 | 12/2020 | Khlat |
| 2020/0382066 A1 | 12/2020 | Khlat |
| 2021/0036596 A1 | 2/2021 | Jeon et al. |
| 2021/0036604 A1 | 2/2021 | Khlat et al. |
| 2021/0075372 A1 | 3/2021 | Henzler et al. |
| 2021/0099137 A1 | 4/2021 | Drogi et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194437 A1 | 6/2021 | Stockert |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |

(56) References Cited

U.S. PATENT DOCUMENTS

| | | |
|---|---|---|
| 2021/0257971 A1 | 8/2021 | Kim et al. |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1 | 11/2021 | Park |
| 2022/0021348 A1 | 1/2022 | Philpott et al. |
| 2022/0094256 A1 | 3/2022 | Radhakrishnan et al. |
| 2022/0103137 A1 | 3/2022 | Khlat et al. |
| 2022/0123698 A1 | 4/2022 | Goto et al. |
| 2022/0123744 A1 | 4/2022 | Khlat |
| 2022/0181974 A1 | 6/2022 | Liu et al. |
| 2022/0224294 A1 | 7/2022 | Khlat et al. |
| 2022/0278651 A1 | 9/2022 | Khlat |
| 2022/0286094 A1 | 9/2022 | Granger-Jones et al. |
| 2022/0385239 A1 | 12/2022 | Khlat |
| 2022/0399861 A1 | 12/2022 | Khlat |
| 2023/0113677 A1 | 4/2023 | Boley et al. |

FOREIGN PATENT DOCUMENTS

| | | |
|---|---|---|
| CN | 104620509 A | 5/2015 |
| CN | 104954301 A | 9/2015 |
| CN | 105322894 A | 2/2016 |
| CN | 105680807 A | 6/2016 |
| CN | 105703716 A | 6/2016 |
| CN | 105721366 A | 6/2016 |
| CN | 106208974 A | 12/2016 |
| CN | 106209270 A | 12/2016 |
| CN | 106877824 A | 6/2017 |
| CN | 107093987 A | 8/2017 |
| CN | 107980205 A | 5/2018 |
| CN | 108141184 A | 6/2018 |
| CN | 109150212 A | 1/2019 |
| EP | 3174199 A2 | 5/2012 |
| EP | 2909928 A1 | 8/2015 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

First Office Action for Chinese Patent Application No. 202010083654.0, mailed May 12, 2023, 17 pages.
Notification to Grant for Chinese Patent Application No. 202010097807.7, mailed Jul. 11, 2023, 14 pages.
International Preliminary Report on Patentability for International Patent Application No. PCT/US2021/050892, mailed Oct. 24, 2022, 20 pages.
Advisory Action for U.S. Appl. No. 17/073,764, mailed May 26, 2023, 3 pages.
Non-Final Office Action for U.S. Appl. No. 14/836,634, mailed May 16, 2016, 9 pages.
Non-Final Office Action for U.S. Appl. No. 14/868,890, mailed Jul. 14, 2016, 13 pages.
Non-Final Office Action for U.S. Appl. No. 15/792,909, mailed May 18, 2018, 13 pages.
Notice of Allowance for U.S. Appl. No. 15/459,449, mailed Mar. 28, 2018, 7 pages.
Notice of Allowance for U.S. Appl. No. 15/723,460, mailed Jul. 24, 2018, 8 pages.
Notice of Allowance for U.S. Appl. No. 15/704,131, mailed Jul. 17, 2018, 7 pages.
Notice of Allowance for U.S. Appl. No. 15/728,202, mailed Aug. 2, 2018, 7 pages.
Non-Final Office Action for U.S. Appl. No. 15/888,300, mailed Aug. 28, 2018, 11 pages.
Notice of Allowance for U.S. Appl. No. 15/792,909, mailed Dec. 19, 2018, 11 pages.
Notice of Allowance for U.S. Appl. No. 15/993,705, mailed Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, mailed May 2, 2019, 14 pages.
Non-Final Office Action for U.S. Appl. No. 15/986,948, mailed Mar. 28, 2019, 8 pages.
Non-Final Office Action for U.S. Appl. No. 16/018,426, mailed Apr. 11, 2019, 11 pages.
Supplemental Notice of Allowability for U.S. Appl. No. 15/902,244, mailed Mar. 20, 2019, 6 pages.
Notice of Allowance for U.S. Appl. No. 15/902,244, mailed Feb. 8, 2019, 8 pages.
Advisory Action for U.S. Appl. No. 15/888,300, mailed Jun. 5, 2019, 3 pages.
Notice of Allowance for U.S. Appl. No. 15/984,566, mailed May 21, 2019, 6 pages.
Notice of Allowance for U.S. Appl. No. 16/150,556, mailed Jul. 29, 2019, 7 pages.
Non-Final Office Action for U.S. Appl. No. 15/888,300, mailed Jun. 27, 2019, 17 pages.
Final Office Action for U.S. Appl. No. 15/986,948, mailed Aug. 27, 2019, 9 pages.
Advisory Action for U.S. Appl. No. 15/986,948, mailed Nov. 8, 2019, 3 pages.
Notice of Allowance for U.S. Appl. No. 15/986,948, mailed Dec. 13, 2019, 7 pages.
Final Office Action for U.S. Appl. No. 16/018,426, mailed Sep. 4, 2019, 12 pages.
Advisory Action for U.S. Appl. No. 16/018,426, mailed Nov. 19, 2019, 3 pages.
Notice of Allowance for U.S. Appl. No. 16/180,887, mailed Jan. 13, 2020, 8 pages.
Notice of Allowance for U.S. Appl. No. 15/888,300, mailed Jan. 14, 2020, 11 pages.
Non-Final Office Action for U.S. Appl. No. 16/122,611, mailed Mar. 11, 2020, 16 pages.
Corrected Notice of Allowability for U.S. Appl. No. 15/888,300, mailed Feb. 25, 2020, 7 pages.
Notice of Allowance for U.S. Appl. No. 16/018,426, mailed Mar. 31, 2020, 7 pages.
Non-Final Office Action for U.S. Appl. No. 16/174,535, mailed Feb. 4, 2020, 7 pages.
Quayle Action for U.S. Appl. No. 16/354,234, mailed Mar. 6, 2020, 8 pages.
Notice of Allowance for U.S. Appl. No. 16/354,234, mailed Apr. 24, 2020, 9 pages.
Non-Final Office Action for U.S. Appl. No. 16/246,859, mailed Apr. 28, 2020, 9 pages.
Corrected Notice of Allowability for U.S. Appl. No. 15/888,300, mailed May 13, 2020, 7 pages.
Notice of Allowance for U.S. Appl. No. 16/155,127, mailed Jun. 1, 2020, 8 pages.
Final Office Action for U.S. Appl. No. 16/174,535, mailed Jul. 1, 2020, 7 pages.
Non-Final Office Action for U.S. Appl. No. 16/284,023, mailed Jun. 24, 2020, 7 pages.
Non-Final Office Action for U.S. Appl. No. 16/435,940, mailed Jul. 23, 2020, 6 pages.
Final Office Action for U.S. Appl. No. 15/888,300, mailed Feb. 15, 2019, 15 pages.
Final Office Action for U.S. Appl. No. 16/122,611, mailed Sep. 18, 2020, 17 pages.
Advisory Action for U.S. Appl. No. 16/174,535, mailed Sep. 24, 2020, 3 pages.
Notice of Allowance for U.S. Appl. No. 16/174,535, mailed Oct. 29, 2020, 7 pages.
Notice of Allowance for U.S. Appl. No. 16/246,859, mailed Sep. 18, 2020, 8 pages.
Final Office Action for U.S. Appl. No. 16/284,023, mailed Nov. 3, 2020, 7 pages.

(56) References Cited

OTHER PUBLICATIONS

Quayle Action for U.S. Appl. No. 16/421,905, mailed Aug. 25, 2020, 5 pages.
Non-Final Office Action for U.S. Appl. No. 16/416,812, mailed Oct. 16, 2020, 8 pages.
Non-Final Office Action for U.S. Appl. No. 16/514,051, mailed Nov. 13, 2020, 9 pages.
Non-Final Office Action for U.S. Appl. No. 16/774,060, mailed Aug. 17, 2020, 6 pages.
Notice of Allowance for U.S. Appl. No. 16/122,611, mailed Dec. 1, 2020, 9 pages.
Examination Report for European Patent Application No. 21790723.7, mailed Mar. 7, 2024, 5 pages.
Notice of Allowance for U.S. Appl. No. 17/343,912, mailed Mar. 4, 2024, 7 pages.
Non-Final Office Action for U.S. Appl. No. 17/331,996, mailed Feb. 1, 2024, 9 pages.
Notice of Allowance for U.S. Appl. No. 17/331,996, mailed Mar. 1, 2024, 8 pages.
Quayle Action for U.S. Appl. No. 16/589,940, mailed Dec. 4, 2020, 8 pages.
Notice of Allowance for U.S. Appl. No. 16/122,611, mailed Jan. 13, 2021, 8 pages.
Notice of Allowance for U.S. Appl. No. 16/284,023, mailed Jan. 19, 2021, 7 pages.
Notice of Allowance for U.S. Appl. No. 16/416,812, mailed Feb. 16, 2021, 8 pages.
Non-Final Office Action for U.S. Appl. No. 16/689,236 mailed Mar. 2, 2021, 15 pages.
Notice of Allowance for U.S. Appl. No. 16/435,940, mailed Dec. 21, 2020, 7 pages.
Notice of Allowance for U.S. Appl. No. 16/774,060, mailed Feb. 3, 2021, 7 pages.
Notice of Allowance for U.S. Appl. No. 16/590,790, mailed Jan. 27, 2021, 7 pages.
Notice of Allowance for U.S. Appl. No. 16/661,061, mailed Feb. 10, 2021, 7 pages.
Notice of Allowance for U.S. Appl. No. 16/122,611, mailed Apr. 1, 2021, 8 pages.
Non-Final Office Action for U.S. Appl. No. 16/582,471, mailed Mar. 24, 2021, 11 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/689,236 mailed Jun. 9, 2021, 7 pages.
Non-Final Office Action for U.S. Appl. No. 16/775,554, mailed Jun. 14, 2021, 5 pages.
Notice of Allowance for U.S. Appl. No. 16/582,471, mailed Jun. 22, 2021, 9 pages.
Non-Final Office Action for U.S. Appl. No. 16/597,952, mailed May 26, 2021, 7 pages.
Notice of Allowance for U.S. Appl. No. 16/834,049, mailed Jun. 24, 2021, 8 pages.
Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, mailed Nov. 4, 2021, 8 pages.
Notice of Allowance for U.S. Appl. No. 16/582,471, mailed Feb. 1, 2022, 9 pages.
Non-Final Office Action for U.S. Appl. No. 16/597,952, mailed Nov. 10, 2021, 9 pages.
Quayle Action for U.S. Patent Application No. 16/855, 154, mailed Oct. 25, 2021, 6 pages.
Non-Final Office Action for U.S. Appl. No. 16/807,575, mailed Jan. 31, 2022, 12 pages.
International Search Report and Written Opinion for International Patent Application No. PCT/US2021/050892, mailed Jan. 5, 2022, 20 pages.
International Search Report and Written Opinion for International Patent Application No. PCT/US2021/052151, mailed Jan. 4, 2022, 16 pages.
International Search Report and Written Opinion for International Patent Application No. PCT/US2021/054141 mailed Jan. 25, 2022, 15 pages.
Notice of Allowance for U.S. Appl. No. 17/115,982, mailed Nov. 12, 2021, 8 pages.
Non-Final Office Action for U.S. Appl. No. 17/126,561, mailed Oct. 14, 2021, 6 pages.
Non-Final Office Action for U.S. Appl. No. 17/032,553, mailed Mar. 21, 2022, 4 pages.
Non-Final Office Action for U.S. Appl. No. 17/073,764, mailed Dec. 24, 2021, 22 pages.
International Search Report and Written Opinion for International Patent Application No. PCT/US2021/052830, mailed Jan. 24, 2022, 13 pages.
Notice of Allowance for U.S. Appl. No. 15/964,762, mailed Mar. 18, 2019, 7 pages.
Non-Final Office Action for U.S. Appl. No. 17/363,568, mailed Nov. 9, 2023, 8 pages.
Decision to Grant for Chinese Patent Application No. 202010083654.0, mailed Sep. 11, 2023, 8 pages.
Notification to Grant for Chinese Patent Application No. 202010083654.0, mailed Nov. 9, 2023, 8 pages.
Notice of Allowance for U.S. Appl. No. 17/363,568, mailed Jan. 3, 2024, 7 pages.
Non-Final Office Action for U.S. Appl. No. 17/343,912, mailed Dec. 14, 2023, 6 pages.
Quayle Action for U.S. Appl. No. 17/351,560, mailed Nov. 24, 2023, 7 pages.
Notice of Allowance for U.S. Appl. No. 17/351,560, mailed Jan. 4, 2024, 7 pages.
Notice of Allowance for U.S. Appl. No. 15/984,566, mailed Mar. 18, 2019, 7 pages.
Non-Final Office Action for U.S. Appl. No. 16/263,316, mailed Dec. 23, 2019, 10 pages.
Final Office Action for U.S. Appl. No. 16/263,316, mailed May 13, 2020, 10 pages.
Non-Final Office Action for U.S. Appl. No. 16/263,316, mailed Jul. 17, 2020, 4 pages.
Non-Final Office Action for U.S. Appl. No. 16/263,316, mailed Nov. 24, 2020, 4 pages.
Notice of Allowance for U.S. Appl. No. 16/263,316, mailed Mar. 30, 2021, 7 pages.
Final Office Action for U.S. Appl. No. 16/807,575, mailed May 4, 2022, 12 pages.
Advisory Action for U.S. Appl. No. 16/807,575, mailed Jul. 28, 2022, 3 pages.
Notice of Allowance for U.S. Appl. No. 16/807,575, mailed Aug. 19, 2022, 8 pages.
Notice of Allowance for U.S. Appl. No. 17/148,064, mailed Aug. 18, 2022, 8 pages.
Non-Final Office Action for U.S. Appl. No. 17/163,642, mailed Aug. 17, 2022, 9 pages.
Final Office Action for U.S. Appl. No. 17/032,553, mailed Jul. 29, 2022, 6 pages.
Final Office Action for U.S. Appl. No. 17/073,764, mailed Jun. 1, 2022, 22 pages.
Advisory Action for U.S. Appl. No. 17/073,764, mailed Aug. 23, 2022, 3 pages.
Extended European Search Report for European Patent Application No. 22153526.3, mailed Jul. 13, 2022, 9 pages.
Notice of Allowance for U.S. Appl. No. 17/073,764, mailed Aug. 23, 2023, 12 pages.
Notice of Allowance for U.S. Appl. No. 17/163,642, mailed Mar. 1, 2023, 10 pages.

(56) References Cited

OTHER PUBLICATIONS

Final Office Action for U.S. Appl. No. 17/073,764, mailed Mar. 3, 2023, 14 pages.

International Preliminary Report on Patentability for International Patent Application No. PCT/US2021/052830, mailed Feb. 20, 2023, 21 pages.

International Preliminary Report on Patentability for International Patent Application No. PCT/US2021/052151, mailed Oct. 13, 2022, 21 pages.

International Preliminary Report on Patentability for International Patent Application No. PCT/US2021/054141, mailed Sep. 29, 2022, 20 pages.

Non-Final Office Action for U.S. Appl. No. 17/146,765, mailed Sep. 7, 2022, 10 pages.

Final Office Action for U.S. Appl. No. 17/163,642, mailed Nov. 25, 2022, 13 pages.

Notice of Allowance for U.S. Appl. No. 17/032,553, mailed Oct. 11, 2022, 7 pages.

Non-Final Office Action for U.S. Appl. No. 17/073,764, mailed Sep. 30, 2022, 13 pages.

Intention to Grant for European Patent Application No. 21806074.7, mailed May 10, 2024, 27 pages.

Notice of Allowance for U.S. Appl. No. 17/363,568, mailed Apr. 17, 2024, 6 pages.

Notice of Allowance for U.S. Appl. No. 17/331,996, mailed Jun. 14, 2024, 9 pages.

Notice of Allowance for U.S. Appl. No. 17/351,560, mailed Apr. 19, 2024, 8 pages.

International Search Report and Written Opinion for International Patent Application No. PCT/US2023/085103, mailed Apr. 26, 2024, 17 pages.

Ma, Hongyan, "Application and implementation of envelope tracking technology in mobile terminal RF power amplifier," Computers and Telecommunications, Oct. 2017, 18 pages.

First Office Action for Chinese Patent Application No. 201910092452. X, mailed Jul. 31, 2024, 17 pages.

First Office Action for Chinese Patent Application No. 201910512645. 6, mailed Jul. 3, 2024, 15 pages.

First Office Action for Chinese Patent Application No. 201911232472. 9, mailed Jul. 23, 2024, 10 pages.

First Office Action for Chinese Patent Application No. 201911312703. 7, mailed Jul. 16, 2024, 10 pages.

Notice of Allowance for U.S. Appl. No. 17/363,568, mailed Sep. 19, 2024, 6 pages.

Non-Final Office Action for U.S. Appl. No. 18/254,155, mailed Sep. 4, 2024, 14 pages.

Corrected Notice of Allowability for U.S. Appl. No. 17/331,996, mailed Aug. 1, 2024, 6 pages.

Notice of Allowance for U.S. Appl. No. 18/039,805, mailed Sep. 26, 2024, 10 pages.

Corrected Notice of Allowability and Response to Rule 312 Communication for U.S. Appl. No. 18/039,805 mailed Nov. 21, 2024, 5 pages.

* cited by examiner

POWER AMPLIFIER SYSTEM

RELATED APPLICATIONS

This application claims the benefit of provisional patent application Ser. No. 63/149,556, filed Feb. 15, 2021, the disclosure of which is hereby incorporated herein by reference in its entirety.

FIELD OF THE DISCLOSURE

The present disclosure relates generally to radio frequency transmitters and, more particularly, to envelope tracking circuits that control Doherty-type power amplifiers within radio frequency transmitters.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as wireless fidelity (Wi-Fi), long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices.

Various power amplifier arrangements have been proposed and implemented in transmitter chains within the mobile communication devices to provide the desired output power while also meeting the power level control requirements of 5G-NR. One such power amplifier arrangement is the Doherty amplifier, which uses a carrier amplifier to operate at voltages up to the average power and uses the carrier amplifier and a peaking amplifier to operate at voltages between the average power and a peak power. While the Doherty amplifier provides options for providing power amplification, there remains room for improved energy efficiency and linearity during power amplification.

SUMMARY

A power amplifier system having a carrier amplifier having a first supply node, a peaking amplifier having a second supply node, and envelope tracking (ET) circuitry is disclosed. The ET circuitry has a first tracking amplifier that generates a first voltage signal at the first supply node, a second tracking amplifier that generates a second voltage signal at the second supply node, and a transistor coupled between the first supply node and the second supply node and a control input terminal. The first tracking amplifier and the second tracking amplifiers may also be referred to as parallel amplifiers. A control circuit has a first input coupled to an output of both or either of the first tracking amplifier and the second tracking amplifier and a control output terminal coupled to a control input terminal of the transistor, wherein the control circuit is configured to progressively turn on the transistor to pass current from the first supply node to the second supply node as the peaking amplifier progressively becomes active.

This disclosure relates to envelope tracking operation with barely Doherty power amplifiers for additional enhanced transmitter efficiency, where a barely Doherty amplifier shows an increase of about 5% extra power-added efficiency versus average power tracking amplifiers, and where the combined barely Doherty with envelope tracking shows about +18% extra power-added efficiency versus average power tracking amplifiers.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
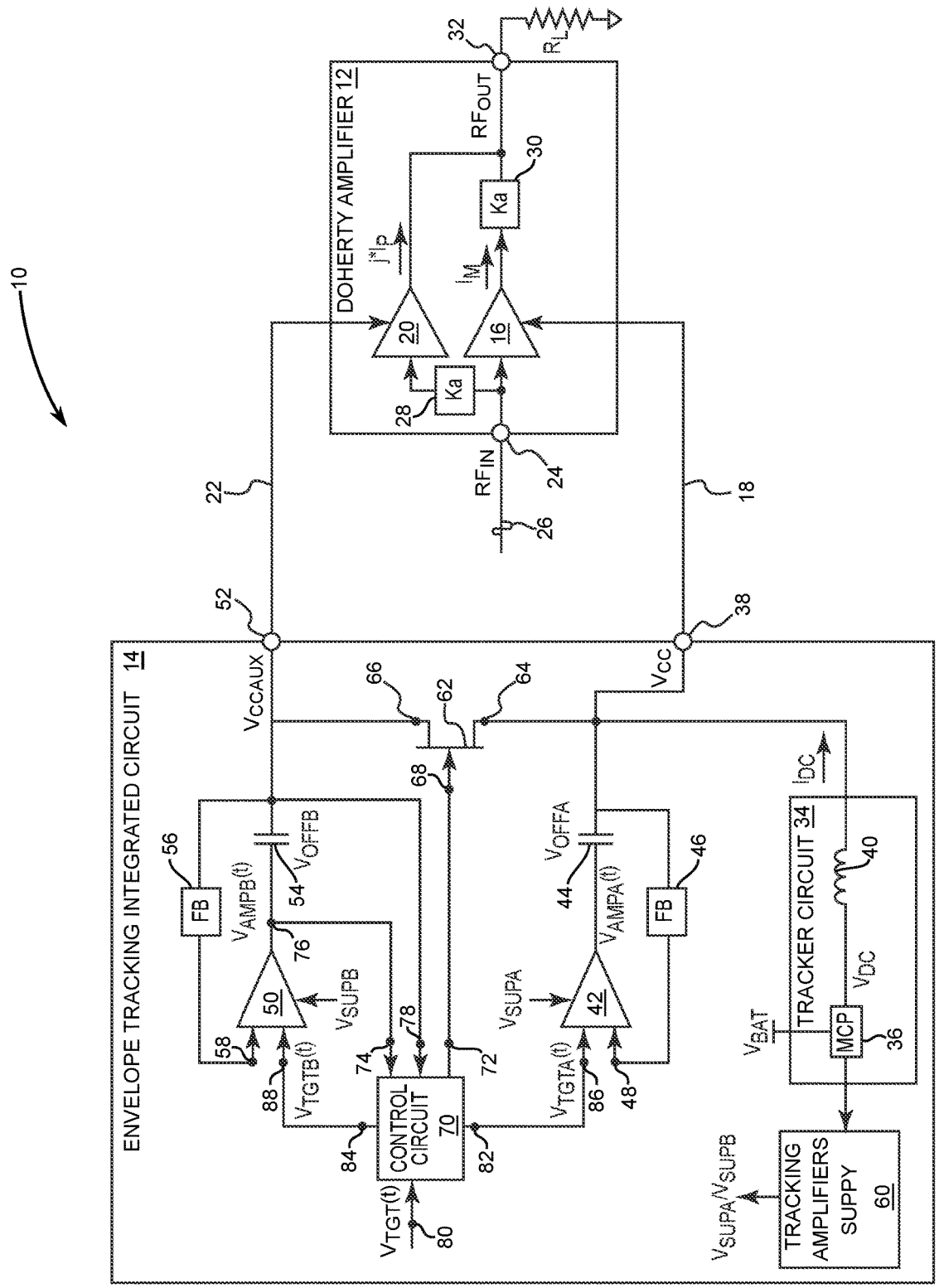
FIG. 1 is a schematic diagram of a power amplifier system that includes envelope tracking circuitry that is configured in accordance with the present disclosure to generate two modulated supply voltages from a single tracker circuit that energizes a Doherty power amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to envelope tracking integrated circuits (ETICs) with an approach referred to as DiVeRT, which stands for Dual instantaneous Voltage enhanced Rapid Tracking, which creates two simultaneous modulated power supply voltages from a single tracker circuit and thus enables new power amplifier topologies of modulating the collector of power amplifiers.

Separately modulating the driver stage from the final output stages of power amplifiers allows wide modulation bandwidth ET such as ET 200 MHz, where the modulation of the first driver stage has the corresponding Vcc time-aligned to the radio frequency (RF) envelope and where the modulation of the final stages has the corresponding Vcc time-aligned to the RF envelope, which usually is slightly delayed by interstage networks.

Separately modulating the carrier amplifier stages and the peaking amplifier stages for a barely Doherty (or load modulation) power amplifier, that is, the separate envelope tracking of carrier and peaking amplifiers, enables additional bias control of these two amplifier stages almost for free and minimizes degradation due to turn-on or turn-off of the peaking amplifier and enhances efficiency in addition to the load modulation itself and recovers the efficiency drop due to the use of barely Doherty approach. This is called $D^2E$, which stands for Doherty and dual ET method in accordance with the present disclosure.

Modulating two power amplifiers used in transmit (TX) diversity transmitting at either similar power or at different power levels the same RF modulation signal allows operation with a traditional approach of modulating both driver and final output stages of power amplifiers in different modes of ET, such as ProET (progressive Voffset (e) envelope tracking) or normal ET, or of average power tracking (APT), or APeT, which stands for operating in ET while using the APT controller with a tracking amplifier disabled.

FIG. 1 is a schematic diagram of a power amplifier system 10 that in accordance with the present disclosure includes a Doherty power amplifier (PA) 12 and envelope tracking (ET) circuitry 14. In the exemplary embodiment of FIG. 1, the envelope tracking circuitry 14 is in the form of an ETIC.

The Doherty PA 12 has a carrier amplifier 16 having a first supply node 18 and a peaking amplifier 20 having a second supply node 22. The Doherty PA 12 has a radio frequency (RF) signal input 24 that couples an RF signal 26 to the carrier amplifier 16 and the peaking amplifier 20. However, the RF signal 26 passes through a first impedance inverter 28 denoted "Ka" before reaching the peaking amplifier 20. In operation, the carrier amplifier 16 generates a main current signal $I_M$ that passes through a second impedance inverter 30 before reaching an RF output 32. The peaking amplifier 20 generates a peaking current signal j*Ip that combines in-phase with the main current signal $I_M$ before being output through the RF output 32. A load $R_L$ is coupled between the RF output 32 and a fixed voltage node such as ground. The load $R_L$ is typically an antenna through which an amplified version of the RF signal 26 is transmitted.

A single tracker circuit 34 of the ET circuitry 14 supplies power to the Doherty amplifier 12. The single tracker circuit 34 is configured to generate two modulated Vcc supply voltages, Vcc and Vccaux. A micro-charge-pump (MCP) 36 has an output coupled to a first supply output 38 through a power inductor 40. The MCP 36 is energized by a battery voltage $V_{BAT}$. The first supply node 18 is coupled to the first supply output 38 to supply power the carrier amplifier 16.

The ET circuitry 14 also includes a first tracking amplifier 42 coupled to the first supply output 38 by way of a relatively large capacitance (~2.2 µF) of a first offset capacitor 44. A first offset voltage $V_{OFFA}$ is present across the first offset capacitor 44 during operation. A first feedback (FB) network 46 is coupled between the first supply output 38 and a first tracking input 48 of the first tracking amplifier 42.

The ET circuitry 14 also includes a second tracking amplifier 50 coupled to a second supply output 52 by way of a relatively small capacitance (~10 nF) of a second offset capacitor 54. A second offset voltage $V_{OFFB}$ is present across the second offset capacitor 54 during operation. A second feedback (FB) network 56 is coupled between the second supply output 52 and a second tracking input 58 of the second tracking amplifier 50. The second supply node 22 is coupled to the second supply output 52 to supply power the peaking amplifier 20.

A tracking amplifiers supply 60 generates a first tracking amplifier supply voltage $V_{SUPA}$ that energizes the first tracking amplifier 42. The tracking amplifiers supply 60 also generates a second tracking amplifier supply voltage $V_{SUPB}$ that energizes the second tracking amplifier 50. In some embodiments, the MCP 36 may supply a direct current voltage that the tracking amplifiers supply 60 uses to generate the first tracking amplifier supply voltage $V_{SUPA}$ and second tracking amplifier supply voltage $V_{SUPB}$.

A field effect transistor (FET) 62 has a first current terminal 64 coupled to the first supply node 18 through the first output 38. The FET 62 also has a second current terminal 66 coupled to the second supply node 22 through the second supply output 52. A control terminal 68 is used to control the FET 62. A control circuit 70 has a control output 72 coupled to the control terminal 68, wherein the control circuit 70 is configured to control the FET 62 to behave as a current source in a linear mode or as a closed switch or as an open switch. In at least some embodiments, the control circuit 70 includes a digital processor configured to read values from look-up tables, apply the values to digital-to-analog converters, and read signal values from analog-to-digital converters. In the exemplary embodiment of FIG. 1, the control circuit 70 has a first sense input 74 coupled to a tracking output 76 of the second tracking amplifier 50 and a second sense input 78 coupled to the second supply output 52. A differential sensed voltage between the first sense input 74 and the second sense input 78 is equal to the second offset voltage $V_{OFFB}$.

An external transceiver produces a target Vramp modulation signal $V_{TGT(t)}$ that is received at a Vramp input 80 of the control circuit 70. The control circuit 70 is configured to respond to the target Vramp modulation signal $V_{TGT(t)}$ by simultaneously generating a first target signal $V_{TGTA(t)}$ at a first target signal output 82 and a second target signal $V_{TGTB(t)}$ at a second target signal output 84. The first target signal $V_{TGTA(t)}$ and the second target $V_{TGTB(t)}$ can have different amplitude shapes and different time alignment relative to each other. The first target signal output 82 is coupled to a first target signal input 86 of the first tracking amplifier 42. In response, the first tracking amplifier 42 generates a first tracking amplifier signal $V_{AMPA(t)}$. The second target signal output 84 is coupled to a second target signal input 88 of the second tracking amplifier 50. In response, the second tracking amplifier 50 generates a second tracking amplifier signal $V_{AMPB(t)}$. Both the first supply voltage Vcc and the second supply voltage Vccaux track the first tracking amplifier signal $V_{AMPA(t)}$ and the second tracking amplifier signal $V_{AMPB(t)}$.

During operation of the Doherty amplifier 12, the envelope of the RF voltage across the carrier amplifier 16 is called Vm and the associated current is denoted $I_M$. The envelope of the RF voltage across the peaking amplifier is called Vp and the associated current is denoted j*Ip, where j is the imaginary component showing a 90 degree phase difference between the peaking current Ip and the main current $I_M$. Moreover, for the Doherty amplifier 12 is operated as a barely Doherty power amplifier with assumptions that the load-line transformations are not necessarily the same between the two amplifier stages.

Figure 2A:
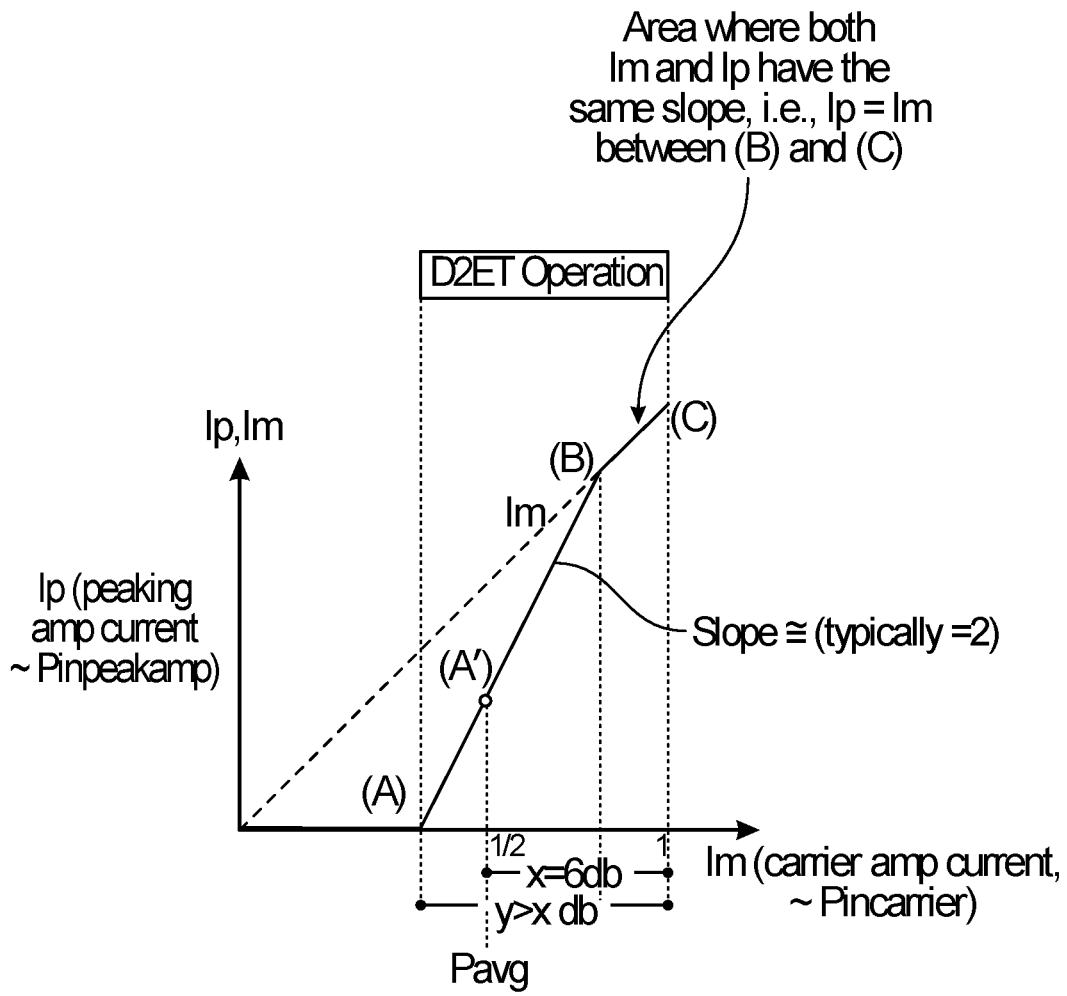
FIG. 2A is a graph showing peaking current of the peaking amplifier versus main current of the carrier amplifier for the Doherty amplifier of FIG. 1.
Figure 2B:
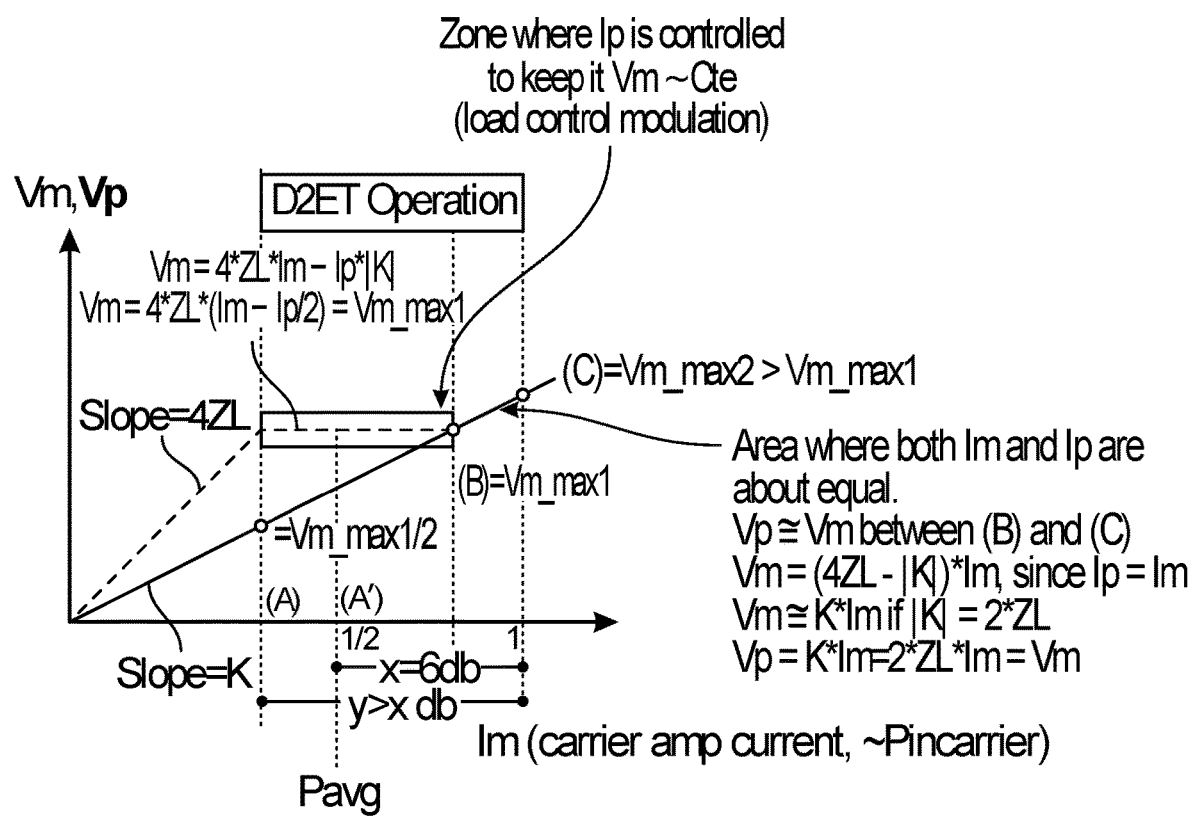
FIG. 2B is a graph showing voltages for the peaking amplifier and the carrier amplifier versus carrier amplifier current for the Doherty amplifier of FIG. 1.

FIGS. 2A and 2B show various currents and voltages in the case of the Doherty amplifier 12 being in operation using the $D^2E$ method in which the peaking amplifier 20 is activated much lower than the −6 dB point relative to the peak envelope; that is, the Doherty operation of load-line modulation terminates or expires well below the peak envelope power and then both the carrier and peaking amplifiers each deliver half of the power between point B and point C.

The average point of the modulation does not necessary fall at point A but can fall in between where the load modulation already has reduced the maximum impedance seen by the carrier amplifier at point A', thus reducing the load modulation efficiency enhancement and thus taking advantage of having envelope tracking on the carrier amplifier 16 to recover efficiency versus an ideal Doherty amplifier.

The peaking amplifier 20 sees different modulation RF voltages when it is activated and can therefore take advantage of having a separate ET modulation on the peaking amplifier 20. The voltage seen by the peaking amplifier 20 at point A is equal to about one half of the voltage seen by the carrier amplifier 16 at point A, and the voltage seen by the peaking amplifier 20 at point B is equal to the same voltage seen by the carrier amplifier 16 at point B, which is twice the voltage at the peaking amplifier 20 at point A. Voltage seen by the carrier amplifier 16 from point B to point C is similar to the voltage seen by the carrier amplifier 20 at these points.

Figure 3:
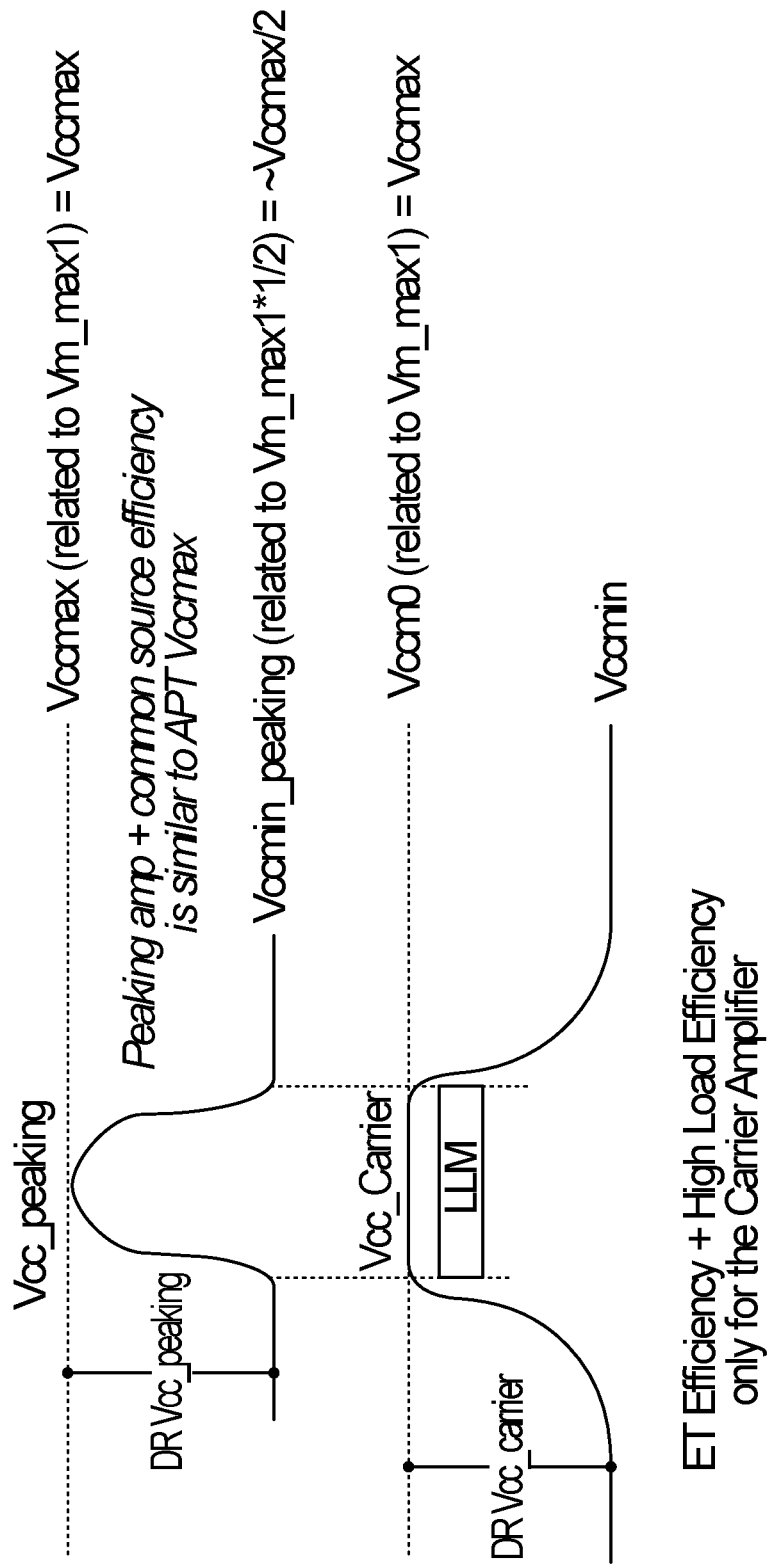
FIG. 3 is a graph showing power supply voltage (Vcc) carrier and Vcc peaking swings for an Ideal Doherty amplifier.

In the case of a modulation signal of peak-to-average ratio of 6 dB and an ideal Doherty case, FIG. 3 shows the modulated Vcc voltages for the carrier amplifier 16 and peaking amplifier 20, where the modulation voltage swing of Vcc_peaking expected by the peaking amplifier is about Vccmax/2 to Vccmax. In the case of the Doherty amplifier 12 being operated as a barely Doherty power amplifier, the modulation voltages change since the load modulation is activated early in time and expires before the peak envelope of the RF modulation is reached.

Figure 4:
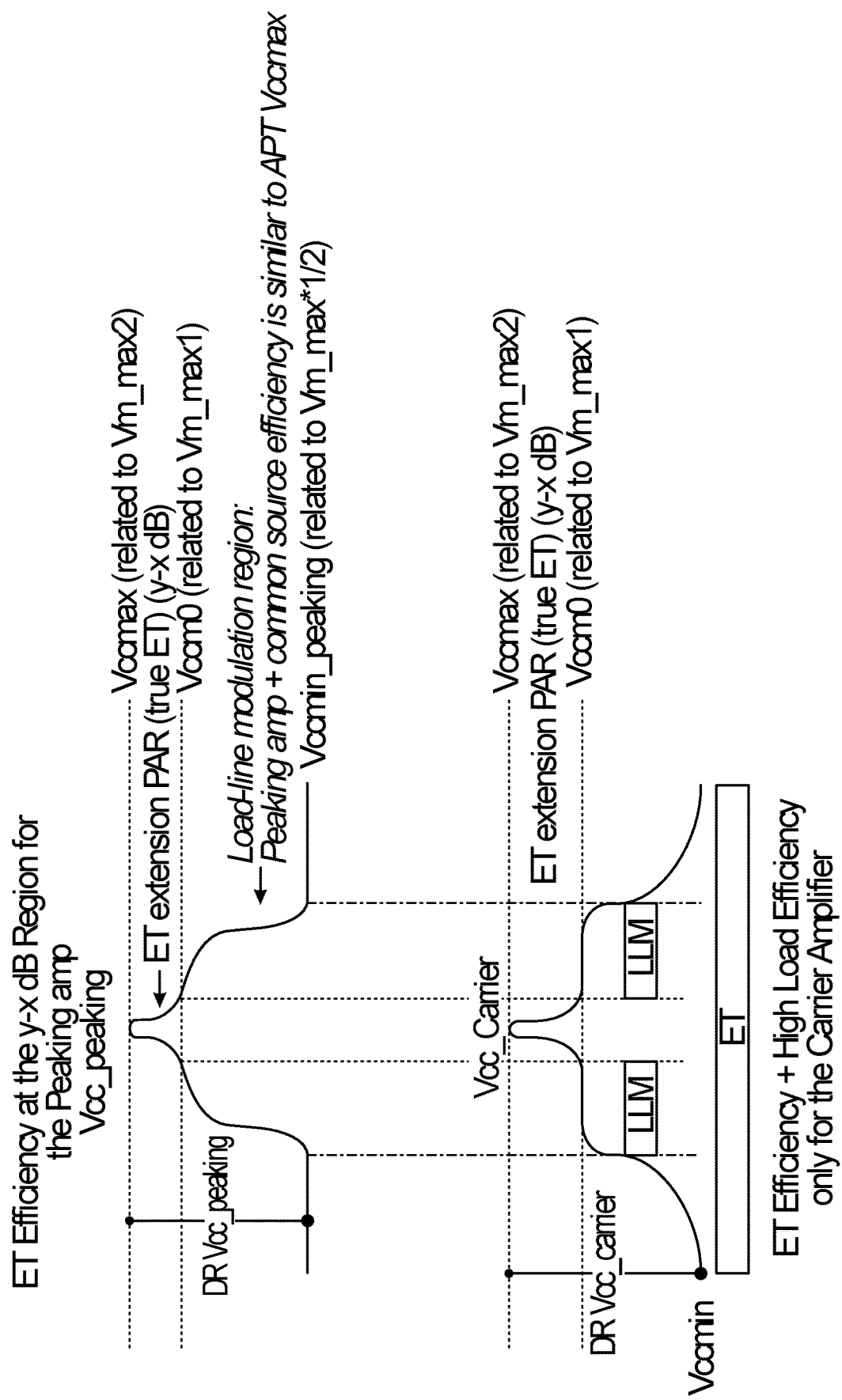
FIG. 4 is a graph showing Vcc carrier and Vcc peaking swings for the Doherty amplifier of FIG. 1.

As shown in FIG. 4, the modulation of the supply voltage Vcc on the peaking amplifier 20 has a lower dynamic range versus the modulation of the supply voltage Vcc of the carrier amplifier 16. This is because the minimum voltage is roughly a voltage equal to Vccm0/2 depicted in FIG. 4. Thus, the second offset capacitor 54 can be pre-charged to a value near Vccm0/2 to supply the second tracking amplifier 50 that drives the supply of the peaking amplifier 20 from a lower voltage supply for improved efficiency. Two separate Vcc modulation voltages Vcc_carrier(t)≥Vcc_peaking(t) allow different load-line conversions and/or two different impedance inverter ratios on each of the carrier amplifier 16 and the peaking amplifier 20. As a result of this flexibility, power efficiency may be maximized.

There may be different linearizations by way of the different supply voltages for the carrier amplifier 16 and the peaking amplifier 20 to maximize the overall linearity of the Doherty amplifier 12. For example, the carrier supply modulation Vcc_carrier(t) can be adjusted in proportion to values stored in an envelope tracking look-up table (ET-LUT) that provides isometric gain operation of the carrier amplifier 16. the peaking supply modulation Vcc_peaking(t) can have another ET-LUT relation relative to the carrier supply modulation Vcc_carrier that allows isometric gain operation of the peaking amplifier 20, such that the overall gain of the Doherty amplifier 12 is linearized by taking advantage of the available two modulated supplies. The Vcc_peaking ET-LUT change relative to the ET-LUT relation vs Vcc_carrier can be implemented inside the ET circuitry 14 directly, which uses the input modulated Vramp signal that is used by the Vcc_carrier as target and modifies this via a built-in mapping change to create another target signal for the Vcc_peaking, as shown in FIG. 1.

Figure 5:
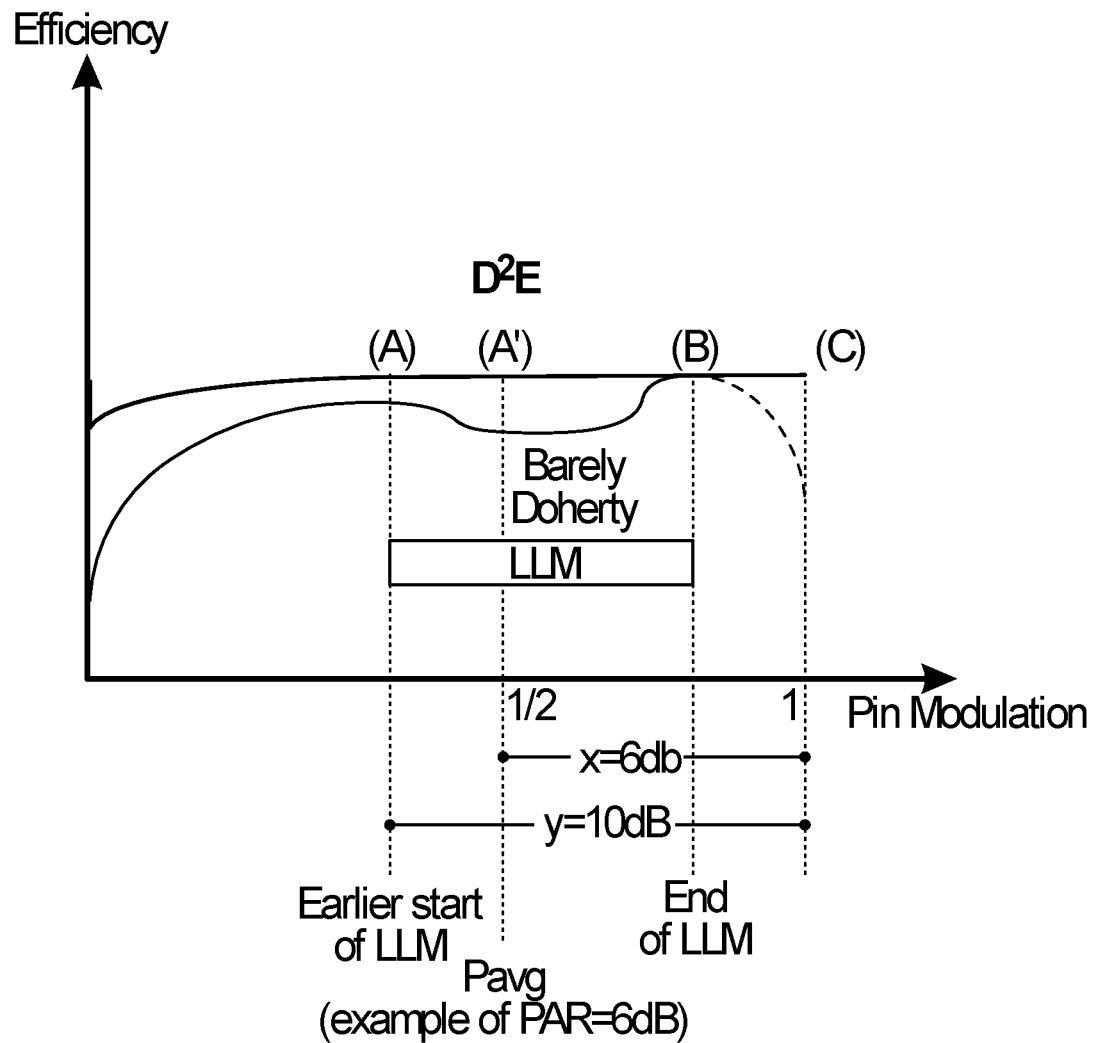
FIG. 5 is a graph illustrating efficiency improvements provided by the power amplifier system of the present disclosure.

FIG. 5 illustrates the efficiency improvements expected, below point A, between the two peaking points A and B, and above point B. The efficiency of the carrier amplifier 16 is good, given the high load line seen in point A and still some good efficiency at point A', although the load line had dropped at point A' due to the barely operation but is improved due to the modulated supply ET operation of the Vcc_carrier between point A and point C to keep operating near compression.

The efficiency of the peaking amplifier 20 is good, but the difference between (Vm(t)–Vp(t)), which represents the voltage across the FET element between Vcc(t) and Vccaux (t) of the ETIC, is dissipating the power for the modulated peaking current that flows through this FET, thus providing the equivalent of having the peaking amplifier supplied from Vccm0 voltage all the time between point A and point B.

The peaking amplifier 20 is biased with a lower supply Vccmin_peaking at the start, where the peaking amplifier is activated and the control of the Vcc_peaking voltage allows better control the RF performances of the peaking amplifier 20 and assigns better bias control at the gate/base and the collector (not shown) versus only bias control on the gate/base of the RF transistors (not shown). The minimum Vcc for the Vcc_peaking can be different from the minimum Vcc_carrier if this helps to better optimize the behavior of the peaking amplifier 20 when it starts or stops to source RF current. The minimum Vcc can also be around half of the Vcc_carrier voltage at the transition point where the peaking amplifier 20 is engaged given that Vp envelope is one half of the Vm envelope. Indirectly, the carrier amplifier 16 and the peaking amplifier 20 can be linearized since each has its own modulated Vcc waveforms that are adjust by values from each ET-LUT.

Note that in embodiments of the present disclosure, the carrier amplifier modulated supply voltage Vcc_carrier (t) is always greater than or equal to the peaking amplifier modulated supply voltage Vcc_peaking (t). Thus, the embodiments of the present disclosure are configured for the DiVeRT approach where Vcc(t)≥Vccaux(t) is required.

Furthermore, the carrier amplifier modulated supply voltage Vcc_carrier (t) has a low peak-to-average ratio and a lower peak-to-minimum voltage ratio. Thus, the tracker amplifier supply voltage $V_{SUPA}$ for the first tracking amplifier 42 may be lower, which increases the energy efficiency of the envelope tracker circuitry 14. Moreover, the peaking amplifier modulated supply voltage Vcc_peaking (t) for the peaking amplifier 20 has a reduced peak-to-mininum voltage ratio swing. The presence of two different voltages $V_{SUPA}$ less than $V_{SUPB}$ used to differently supply the first tracking amplifier 42 and the second tracking amplifier 20, respectively, provides for the maximum energy efficiency for the ET circuitry 14.

There may be a mix and match of different power amplifier topologies using Vcc and Vccaux supply voltages. Further, there may be different time alignment between the Vcc_carrier(t) and Vcc_peaking(t), if there is any mismatch in time between the two RF envelopes at each power amplifier. Each power amplifier stage can be biased in class-AB and take advantage of ET amplitude modulation-amplitude modulation linearization of each amplifier via the respective supply path.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
a carrier amplifier having a first supply node;
a peaking amplifier having a second supply node; and
envelope tracking (ET) circuitry comprising:
a first tracking amplifier configured to generate a first voltage signal at the first supply node;
a second tracking amplifier configured to generate a second voltage signal at the second supply node;
a transistor having a first current terminal coupled the first supply node and a second current terminal coupled to the second supply node; and
a control circuit having a first input coupled to an output of both or either of the first tracking amplifier and the second tracking amplifier and a control output terminal coupled to a control input terminal of the transistor, wherein the control circuit is configured to progressively turn on the transistor to pass current from the first supply node to the second supply node as the peaking amplifier progressively becomes active, wherein the control circuit is configured to cause a rate of change of peaking current supplying the peaking amplifier to be greater than a rate of change of carrier current supplying the carrier amplifier until the carrier current and the peaking current are substantially equal.

2. The power amplifier system of claim 1 wherein the control circuit determines that the peaking amplifier is becoming increasingly active by monitoring a tracking output voltage at the first input of the control circuit.

3. The power amplifier system of claim 2 wherein the control circuit has a second input coupled to the second node to monitor voltage at the second node.

4. The power amplifier system of claim 3 wherein the control circuit is configured to monitor a differential voltage between the first input and the second input and in response progressively turn on the transistor to pass current from the first supply node to the second node as the peaking amplifier progressively becomes active.

5. The power amplifier system of claim 1 wherein the first voltage signal has a first amplitude modulation that follows the envelope of a radio frequency signal received by the ET circuitry and the second voltage signal has a second amplitude modulation that follows the envelope of the radio frequency signal received by the ET circuitry.

6. The power amplifier system of claim 1 wherein the rate of change of peaking current supplying the peaking amplifier has a slope that is at least twice a slope of the rate of change of the carrier current supplying the carrier amplifier.

7. The power amplifier system of claim 1 wherein the ET circuitry is integrated into an ET integrated circuit (ETIC).

8. The power amplifier system of claim 1 wherein the ET circuitry is configured to ensure that a voltage at the first supply node supplying the carrier amplifier is remains greater than or equal to the voltage at the second supply node supplying the peaking amplifier.

9. The power amplifier system of claim 1 wherein the ET circuitry further comprises a tracker circuit having a micro-charge-pump with an output coupled to the first supply node through a power inductor.

10. The power amplifier system of claim 1 wherein the transistor is a field-effect transistor.

11. The power amplifier system of claim 1 wherein the carrier amplifier and the peaking amplifier are coupled in a Doherty amplifier configuration.

12. The power amplifier system of claim 11 further comprising a first impedance inverter coupled between a signal output of the carrier amplifier and a signal output of the peaking amplifier.

13. The power amplifier system of claim 12 further comprising a second impedance inverter coupled between a signal input of the carrier amplifier and a signal input of the peaking amplifier.

14. The power amplifier system of claim 13 wherein the first impedance inverter and the second impedance inverter have substantially different impedance inverter ratios.

15. The power amplifier system of claim 1 further comprising a first capacitor coupled between an output of first tracking amplifier and the first supply node.

16. The power amplifier system of claim 15 further comprising a second capacitor coupled between an output of the second tracking amplifier and the second supply node.

17. The power amplifier system of claim 15 wherein capacitance of the second capacitor is an order of magnitude less than capacitance of the first capacitor.

18. The power amplifier system of claim 1 wherein the control circuit is further configured to adjust a supply voltage at the first supply node based on values stored in a first envelope tracking look-up table (ET-LUT) to provide isometric gain operation of the carrier amplifier.

19. The power amplifier system of claim 1 wherein the control circuit is further configured to adjust a supply voltage at the second supply node based on values stored in a second ET-LUT to provide isometric gain operation of the peaking amplifier.

* * * * *